(12) United States Patent
Uemoto et al.

(10) Patent No.: US 6,204,111 B1
(45) Date of Patent: Mar. 20, 2001

(54) FABRICATION METHOD OF CAPACITOR FOR INTEGRATED CIRCUIT

(75) Inventors: Yasuhiro Uemoto, Otsu; Eiji Fujii, Ibaraki; Koji Arita, Osaka; Yoshihisa Nagano, Suita; Yasuhiro Shimada; Masamichi Azuma, both of Mishima-gun; Atsuo Inoue, Otokuni-gun; Yasufumi Izutsu, Nagaokakyo, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/238,157

(22) Filed: Jan. 28, 1999

Related U.S. Application Data

(63) Continuation-in-part of application No. 08/573,134, filed on Dec. 15, 1995.

(30) Foreign Application Priority Data

Dec. 28, 1994 (JP) .................................................. 6-327818
Jul. 31, 1995 (JP) .................................................. 7-194578

(51) Int. Cl.$^7$ ............................................... H01L 21/8242
(52) U.S. Cl. ............................................................ 438/239
(58) Field of Search ............................ 438/239, 240–267, 438/800; 361/313

(56) References Cited

U.S. PATENT DOCUMENTS

| | | | |
|---|---|---|---|
| 5,005,102 | 4/1991 | Larson | 361/313 |
| 5,216,572 | * 6/1993 | Larson et al. | 361/313 |
| 5,508,753 | 4/1996 | Fukuda et al. | 257/295 |
| 5,543,644 | 8/1996 | Aht et al. | 257/295 |
| 5,554,866 | 9/1996 | Nishioka et al. | 257/295 |
| 5,555,486 | 9/1996 | Kingon et al. | 257/295 |
| 5,561,307 | 10/1996 | Mihara et al. | 257/295 |
| 5,576,564 | 11/1996 | Satoh et al. | 257/295 |
| 5,625,233 | 4/1997 | Cabral, Jr. et al. | 257/295 |
| 5,679,969 | 10/1997 | Evan, Jr. et al. | 257/295 |

FOREIGN PATENT DOCUMENTS

| | | |
|---|---|---|
| 0 404 295 | 12/1990 | (EP) . |
| 0 471 845 | 2/1992 | (EP) . |
| 0 503 078 | 9/1992 | (EP) . |
| 0 503 078 A1 | 9/1992 | (EP) . |
| 0557 937 | 9/1993 | (EP) . |
| 0 609 081 | 8/1994 | (EP) . |
| WO 94 10084 | 5/1994 | (WO) . |

OTHER PUBLICATIONS

Patent Abstracts of Japan, vol. 13, No. 218 (E–761) May 22, 1989.
Patent Abstracts of Japan, vol. 8, No. 239 (E–276) Nov. 2, 1984.

* cited by examiner

*Primary Examiner*—Charles Bowers
*Assistant Examiner*—Craig Thompson
(74) *Attorney, Agent, or Firm*—McDermott, Will & Emery

(57) ABSTRACT

A method for fabricating a capacitor for an integrated circuit, comprising the steps of forming a titanium film for an adhesion layer over a substrate, forming a titanium dioxide film for a diffusion barrier layer by annealing the titanium film after ion-implantation of oxygen ion into a surface region of the titanium film so as to change titanium in the surface region to titanium dioxide, and forming a high dielectric constant capacitor on the titanium dioxide film.

4 Claims, 3 Drawing Sheets

FABRICATION METHOD OF CAPACITOR FOR INTEGRATED CIRCUIT

This patent application is a 37 C.F.R. §1.53(b) Continuation-In-Part of U.S. patent application Ser. No. 08/573,134, filed Dec. 15, 1995.

BACKGROUND OF THE INVENTION

This invention relates to a capacitor for an integrated circuit and its fabrication method.

A technology for applying a high dielectric constant capacitor, such as a ferroelectric capacitor for a Random Access Memory (RAM), has been developed. In a dielectric film of the capacitor, metal oxides such as Lead Zirconate Titanate (PZT), Barium Strontium Titanate (BST) and other high dielectric constant oxides are used. In the bottom and top electrodes of the capacitor, platinum, which is hard to react with the metal oxides, is used. Between the bottom electrode and a silicon substrate, an adhesion layer of a titanium film to improve the adhesive strength between both, and a diffusion barrier layer of a titanium nitride film to prevent the adhesion layer from reacting with the bottom electrode, are formed.

A ferroelectric capacitor is generally fabricated by a method described below.

First, a titanium film, a titanium nitride film and a platinum film for a bottom electrode are deposited in layers on an insulating surface of a silicon substrate by a sputtering method using a titanium target, a titanium nitride target and a platinum target, respectively.

Next, a ferroelectric metal oxide film is deposited on the platinum film by a sputtering method or a sol-gel method, and a platinum film for a top electrode is deposited on the metal oxide film. Then, these films are finished with a predetermined shape and size of the capacitor by etching techniques to remove unnecessary portions of the films, after heat-treatment for improving the dielectric constant of the ferroelectric metal oxide film.

In the fabricated capacitor, some peelings and cracks induced by the heat-treatment are often observed between the substrate and the bottom electrode. This seems to arise because the adhesive strength between the titanium film and the titanium nitride film is not strong, because the titanium film and the titanium nitride film are not formed continuously, but are formed with separate steps.

Another capacitor, which includes a titanium dioxide film formed between the substrate and the bottom electrode instead of the titanium film and the titanium nitride film, is known in the art. The titanium dioxide film acts as both an adhesion layer and a diffusion barrier layer. The fabricating process of this capacitor is that a titanium film, a platinum film for a bottom electrode, a ferroelectric metal dioxide film and a platinum film for a top electrode are deposited in layers on a substrate, and the resulting structure is heated in an oxygen gas atmosphere. As a result, the titanium film becomes a titanium dioxide film. However, in this capacitor, the adhesive strength between the substrate and the titanium dioxide film is not strong, too.

SUMMARY OF THE INVENTION

A preferred method of fabricating a capacitor for an integrated circuit, comprises a step of forming an adhesion layer of a metal over a substrate, a step of forming a diffusion barrier layer of a compound of the metal and a non-metal on the adhesion layer by annealing the adhesion layer after ion implantation of the non-metal into a surface region of the adhesion layer so as to change the metal in the surface region to the compound, a step of forming a bottom electrode layer of a noble metal on the diffusion barrier layer, a step of forming a dielectric layer of a metal oxide on the bottom electrode layer, a step of forming a top electrode layer of a conductive metal on the dielectric layer, a step of etching the top electrode layer and dielectric layer selectively, a step of etching the bottom electrode layer selectively, and a step of etching the diffusion barrier layer and adhesion layer selectively.

Another preferred method of fabricating the capacitor is that a diffusion barrier layer is formed by continuing to sputter the metal in a gas of the non-metal, which is induced at the time when a thickness of the adhesion layer reaches a predetermined thickness, instead of the applications of the ion implantation and the annealed. As a result, the diffusion barrier layer of a compound of the metal and non-metal is formed on the adhesion layer.

As pointed out in greater detail below, capacitors fabricated according to a preferred process provide the important advantage of no or very little peelings at the interface of the adhesion layer and the diffusion barrier layer, because the composition of both layers has continuity, and the adhesive strength between both layers is improved.

The invention itself, together with further advantages, will best be understood by reference to the following detailed description taken in conjunction with the accompanying drawings.

DESCRIPTION OF THE PREFERRED EMBODIMENTS

A first, second and third embodiment of the present invention is explained below, referring to FIGS. 1–8.

Figure 1:
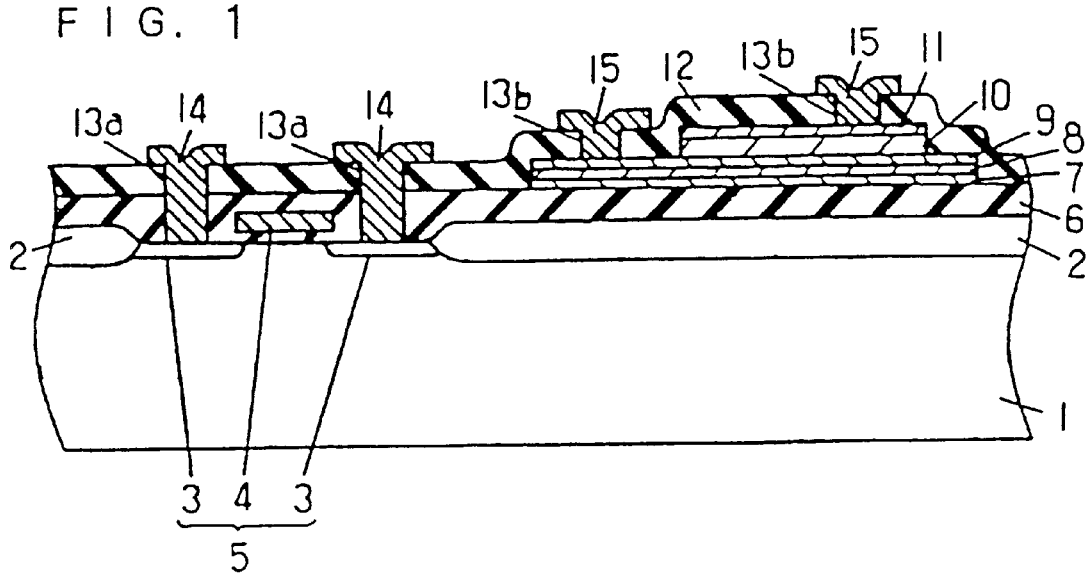
FIG. 1 illustrates a sectional view of a semiconductor device having a capacitor of the present invention.

As shown in FIG. 1, an isolation insulating layer 2 and a MOS transistor 5, comprising a diffusion region 3 and a gate electrode 4, are formed on predetermined regions of a semiconductor substrate 1 by using conventional techniques for constructing an integrated circuit. An interlayer insulating layer 6 covering the layer 2 and MOS transistor 5 are formed on the substrate 1, and an adhesion layer 7 of titanium and a diffusion barrier layer 8 of titanium dioxide are formed in layers on the interlayer insulating layer 6.

A capacitor, comprising a bottom electrode 9 of platinum, a dielectric layer 10 of PZT and a top electrode 11 of platinum is formed on diffusion barrier layer 8, and the capacitor and MOS transistor 5 are covered with a passivation layer 12. Contact holes 13a, reaching to the diffusion region 3, are opened in the interlayer insulating layer 6 and passivation layer 12, and contact holes 13b, reaching to the bottom electrode 9 and top electrode 11, are opened in the passivation layer 12. Aluminum interconnection 14 is connected to diffusion region 3 through contact holes 13a, and aluminum interconnection 15 is connected to the bottom and top electrodes 9, 11, respectively, through contact holes 13b, by using conventional wiring techniques. Further, a layer of titanium nitride or titanium-tungsten alloy (not shown) is disposed between the platinum electrodes 9, 11 and aluminum interconnection 15 in order to improve the connection reliability, by preventing reaction of aluminum and platinum.

A method for fabricating the capacitor is explained below with reference to FIGS. 2–8.

Figure 2:
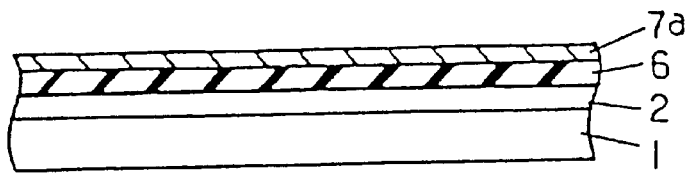
FIGS. 2–10 are sectional views for explaining the various embodiments of the method of forming the capacitor according to the present invention.
Figure 3:
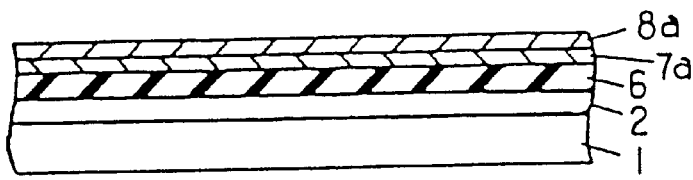

A titanium film 7a for adhesion layer 7, having a thickness of 50 nm, is deposited on interlayer insulating layer 6 by a sputtering method using a titanium target, as shown in FIG. 2. In the next step shown in FIG. 3, oxygen ion is implanted into a surface region of the titanium film 7a by using an ion-implantation apparatus, and then the structure is annealed in an inert atmosphere of argon gas at a temperature of 650° C. As a result, the surface region of the titanium film 7a changes to a titanium dioxide film 8a. At this time, the thickness of titanium dioxide film 8a increases by about two times, compared with the thickness of the surface region of the titanium film 7a. In carrying out the oxygen ion-implantation step, the implantation conditions, such as the amount of the implanted oxygen ions acceleration voltage and other factors are controlled, so that a titanium dioxide film 8a having a thickness of 60 nm is obtained. The thickness of the titanium film 7a after the anneal, and the thickness of the titanium dioxide film 8a are preferably in ranges of 15–25 nm and 50–70 nm, respectively. The annealing temperature is preferably in a range of 500–700° C.

Figure 4:
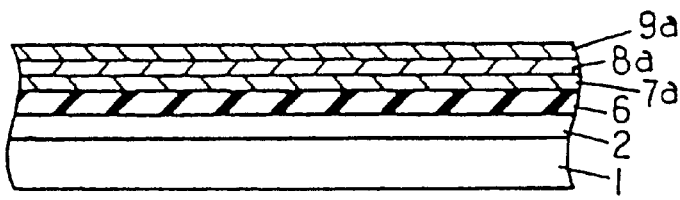
Figure 5:
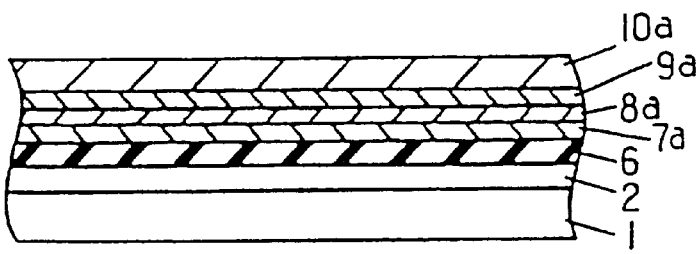
Figure 6:
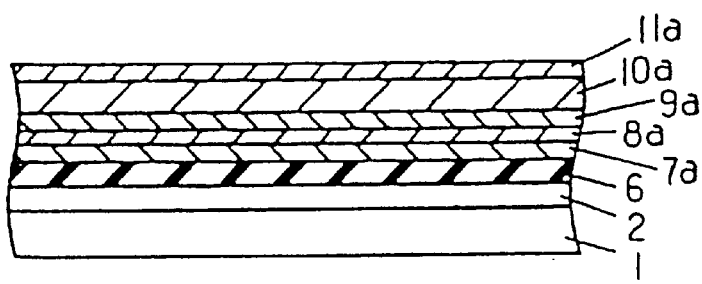

As shown in FIGS. 4–6, a platinum film 9a on the titanium dioxide film 8a, a PZT film 10a on the platinum film 9a and a platinum film 11a on the PZT film 10a are deposited by sputtering. In depositing the platinum films 9a, 11a and the PZT film 10a, a platinum target and a PZT target are used, respectively.

Figure 7:
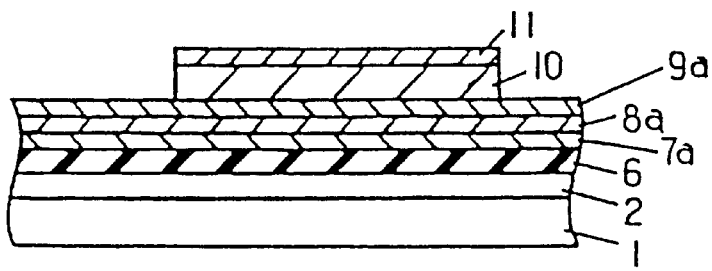
Figure 8:
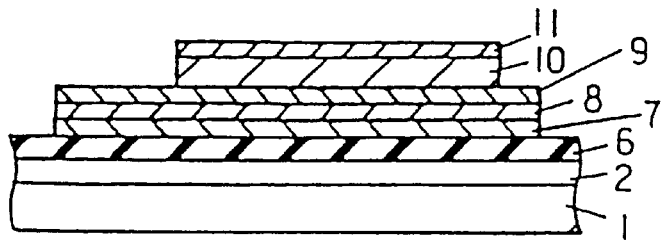

As shown in FIG. 7, the platinum film 11a and the PZT film 10a are etched selectively so as to form a top electrode 11 and dielectric layer 10, having a predetermined shape and size. Then, as shown in FIG. 8, the platinum film 9a, titanium dioxide film 8a and titanium film 7a are etched selectively so as to form a bottom electrode 9, diffusion barrier layer 8 and adhesion layer 7, having a predetermined shape and size. These etching steps are performed by using conventional photolithography and dry etching techniques.

The formation of the diffusion barrier layer 8 by ion-implantation provides several important advantages such as, the adhesive strength between the adhesion layer 7 and the diffusion barrier layer 8 is strong, resulting in little or no peelings between both layers. Further, the titanium dioxide layer 8a is formed accurately in thickness, because it is possible to control the implantation amount and the implantation depth of oxygen ions accurately.

Though the step of ion-implantation is performed before the step of depositing a platinum film 9a for the bottom electrode 9 in the process described above for the first embodiment, the step of ion-implantation can be performed after the step of depositing the platinum film 9a. Namely, a titanium film 7a can first be deposited, and subsequently platinum film 9a deposited thereon. Then, oxygen ions are implanted into the titanium film 7a through the platinum film 9a, and the structure is annealed in an inert atmosphere. As a result, the surface region of the titanium film 7a changes to titanium dioxide, and a titanium dioxide film 8a is formed between its titanium film 7a and the platinum film 9a.

This fabricating method gives the same effect of preventing an occurrence of peelings between the adhesion layer 7 and the diffusion barrier layer 8, as the first embodiment. Further the method keeps the interface between the titanium film 7a and the platinum film 9a clean, because the titanium film 7a and the platinum film 9a are deposited in the same sputtering chamber, without taking out the structure from the chamber while sputtering.

The above-mentioned methods for forming a diffusion barrier layer 8a of titanium dioxide by implanting oxygen ions are applicable to forming the layer 8a of other titanium compounds by implanting other non-metal ions. For example, in other preferable embodiments, titanium nitride film and titanium oxynitride film can be formed by implanting nitrogen ions and a mixture of oxygen ions and nitrogen ions, respectively.

In these alternate cases, little or no peelings between the adhesion layer 7 and diffusion barrier layer 8 were observed. However, the titanium nitride film induces an oxygen defect to the dielectric metal oxide film, because oxygen in the dielectric film is taken in the titanium nitride film. As a result, the leakage current of the capacitor increases.

Among titanium dioxide film, titanium nitride film and titanium oxynitride film, titanium dioxide film gives small leakage current and titanium nitride film gives a large leakage current. Therefore, titanium dioxide film is most preferable as a diffusion barrier layer in the dielectric capacitor.

In addition to the combination of titanium and titanium compound, combinations of other refractory metals such as tantalum, tungsten, molybdenum, etc. and compounds of these refractory metals are applicable to the adhesion layer 7 and diffusion barrier layer 8. Especially, a combination of tantalum and tantalum compounds gives the same effect as the one of titanium and titanium compounds and is one of most preferable combinations. Among tantalum compounds, tantalum oxide is preferable as a diffusion barrier layer 8.

In addition to the sputtering method, an evaporation method and a CVD method are applicable to forming a metal adhesion layer 7.

A second embodiment of the present invention is described below. The second embodiment is different from the first embodiment with respect to the steps of forming titanium film 7a and titanium dioxide film 8a.

In this embodiment, first, a titanium film 7a is deposited on an interlayer insulating layer 6 by sputtering in a sputtering chamber incorporating a titanium target. While sputtering, a predetermined amount of oxygen gas is induced into the chamber at the time that the thickness of the resulting deposited titanium film 7a reaches 20 nm. The sputtering with oxygen gas is continued until the thickness of the resulting deposited titanium dioxide film 8a, formed by the reaction of titanium and oxygen, reaches 60 nm. Thus a 20 nm thick titanium film 7a, and a 60 nm thick titanium dioxide film 8a deposited thereon, are formed by the continuous sputtering process.

Next, in the same manner as the first embodiment, depositions of platinum film 9a, PZT film 10a and platinum film 11a, and etching steps for finishing a capacitor are performed.

In this case, the adhesive strength between the adhesion layer 7 and the diffusion barrier layer 8 is strong and therefore, peelings between both layers occurs very little, because both layers are formed by a continuous sputtering process.

On the other hand, when sputtering is performed while increasing the amount of oxygen gas with sputtering time, a titanium oxide film is deposited, having a gradient composition that increases along the perpendicular direction to the film surface as the oxygen content increases. By using titanium oxide, having the gradient composition as a diffusion barrier layer 8a, the degree of occurrence of peelings and cracks becomes smaller, because the stress induced by thermal expansion is relieved by the gradient composition.

In addition to oxygen gas used in the second embodiment, other non-metal gases are applicable. In particular, nitrogen gas and a mixture of oxygen and nitrogen are preferable. Also, in addition to the titanium target, refractory metal targets such as tantalum, tungsten, molybdenum, etc. can be used. In particular, tantalum film is one of metal films preferred as an adhesion layer 7.

A third embodiment in which the step of forming the titanium dioxide film 8a is different from the first embodiment, is explained below.

First, a titanium film 7a with a thickness of 50 nm is deposited on an interlayer insulating layer 6 in a sputtering chamber using a titanium target. Subsequently, a predetermined amount of oxygen gas is induced into the sputtering chamber, and the surface of the titanium film 7a is annealed by halogen lamps incorporated in the sputtering chamber. As a result, the surface region of the titanium film 7a changes to titanium dioxide, and a titanium dioxide film 8a with a thickness of 60 nm is formed.

Next, in the same manner as the first embodiment, depositions of platinum film 9a, PZT film 10a and platinum film 11a, and etching steps for finishing a capacitor are performed.

In this case, occurrence of peelings and cracks between the adhesion layer 7 and the diffusion barrier layer 8 is suppressed. However, this lamp-annealing method is inferior to the ion-implantation method in controlling the accuracy of the thickness of diffusion barrier layer 8. But, the lamp-annealing method is superior to the ion-implantation method in view of cost, because a lamp-annealing apparatus is less expensive.

In addition to the oxygen gas used in the third embodiment, other non-metal gases are applicable. In particular, nitrogen gas and a mixture of oxygen and nitrogen are preferable. Also, in addition to the titanium target, refractory metal targets such as tantalum, tungsten, molybdenum, etc. can be used. In particular, tantalum film is one of metal films preferred as an adhesion layer 7.

Figure 9:
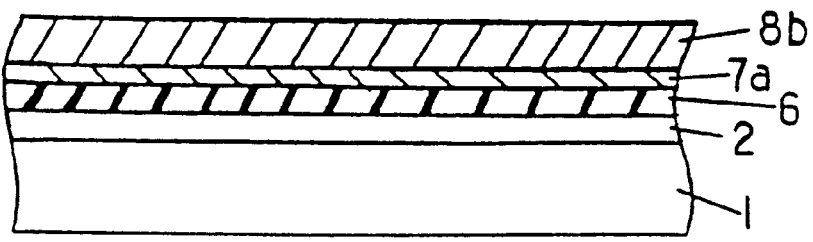

A fourth embodiment in which the step of forming a titanium oxide film is different from the first embodiment, is explained below with reference to FIG. 9.

First, a titanium film 7a with a thickness of 50–100 nm (for example, 50 nm) which becomes an adhesion layer 7 is deposited on an interlayer insulating layer 6 in a sputtering chamber using a titanium target.

Second, the titanium film 7a is annealed in a furnace at a temperature of 300–500° C. (for example, 400° C.) for a period of 10–120 min (for example, 60 min) in oxygen gas, so that a surface portion of titanium film 7a changes to a titanium oxide (TiOx, $1 \leq x \leq 2$) film 8b which becomes a diffusion barrier layer 8, as shown in FIG. 9. Air or ozone gas may be applied to the annealing instead of the oxygen gas.

Next, in the same manner as the first embodiment, deposition of platinum film 9a of 300 nm thickness which becomes a bottom electrode 9, PZT film 10a of 200 nm thickness which becomes a dielectric layer 10, and platinum film 11a of 200 nm thickness which becomes a top electrode 11 are performed. As a film for the dielectric layer 10, $Sr_2BiTa_2O_9$ may be used instead of PZT. And then, top electrode 11 and dielectric layer 10 are formed by selectively etching, and subsequently bottom electrode 9, diffusion barrier layer 8 and adhesion layer 7 are formed by selectively etching.

As described above, a diffusion barrier layer composed of a compound of metal and non-metal is formed by annealing an adhesion layer of a metal in reactive ambient.

Figure 10:
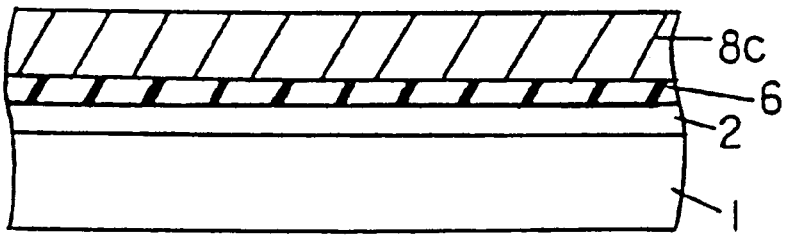

A fifth embodiment in which the stop of forming a titanium oxide film is different from the first embodiment, is explained below with reference to FIG. 10.

First, a titanium film 7a with a thickness of 10–100 nm (for example, 50 nm) which becomes an adhesion layer 7 is deposited on an interlayer insulating layer 6 in a sputtering chamber using a titanium target.

Second, the titanium film 7a is annealed in a furnace at a temperature of 500–800° C. (for example, 650° C.) for a period of 10–120 min (for example, 60 min) in oxygen gas, so that the entire titanium film 7a changes to a titanium oxide (TiOx, $1 \leq x \leq 2$) film 8c which becomes a diffusion barrier layer 8, as shown in FIG. 10. The thickness of the titanium oxide film 8c is approximately double that of the initial titanium film 7a. Air or ozone gas may be applied to the annealing instead of the oxygen gas.

Next, in the same manner as the first embodiment, deposition of platinum film 9a of 300 nm thickness which becomes a bottom electrode 9, PZT film 10a of 200 nm thickness which becomes a dielectric layer 10, and platinum film 11a of 200 nm thickness which becomes a top electrode 11 are performed. As a film for the dielectric layer 10, $Sr_2BiTa_2O_9$ may be used instead of PZT. And then, top electrode 11 and dielectric layer 10 are formed by selectively etching, and subsequently bottom electrode 9 and diffusion barrier layer 8 are formed by selectively etching.

As described above, a diffusion barrier layer composed of a compound of metal and non-metal which is produced by changing an entire adhesion layer of a metal is formed by annealing the adhesion layer in reactive ambient at a high annealing temperature compared with the annealing temperature of the fourth embodiment.

The present invention is not necessarily limited within the range of above-described embodiments of the invention but, needless to say, many modifications of these are possible. For example, in addition to PZT, other dielectric or ferro-electric metal oxides with a high dielectric constant such as BST, PLZT, $Bi_2SrTa_2O_9$ $Bi_2SrNb_2O_9$, etc. can be used as the dielectric film of a capacitor, and also dielectric metal oxides such as a tantalum oxide, etc. may be used. A sol-gel method and a CVD method can be used to form the dielectric layer instead of sputtering. As an electrode material for the capacitor electrodes, a noble metal such as gold, palladium and rhodium, in addition to platinum, and a conductive metal such as aluminum and nickel, can be used.

The position of the capacitor, including an adhesion layer and a diffusion barrier layer, is not limited to the insulating layer formed on a semiconductor substrate. The capacitor may be formed on other layers, such as an interconnection layer, other barrier layer, etc. which are comprised of polysilicon, aluminum alloy, tungsten, tungsten silicide, titanium nitride and so on.

Accordingly, it should be understood that we intend to cover by the appended claims all modifications and equivalents falling within the true spirit and scope of our invention.

What is claimed is:

1. A method for fabricating a capacitor for an integrated circuit comprising the steps of:

forming an adhesion layer of a metal and a diffusion barrier layer of a compound of said metal and a non-metal over a substrate by sputtering said metal continuously by using a target of said metal wherein a gas of said non-metal is induced at the time when a thickness of said adhesion layer reaches to a predetermined thickness;

forming a bottom electrode layer of a noble metal on said diffusion barrier layer;

forming a dielectric layer of a metal oxide on said bottom electrode layer;

forming a top electrode layer of a conductive metal on said dielectric layer;

etching said top electrode layer and dielectric layer selectively;

etching said bottom electrode layer selectively; and etching said diffusion barrier layer and adhesion layer selectively.

2. The method of claim 1, wherein said sputtering is performed with changing an inducing amount of said gas.

3. The method of claim 1, wherein said gas comprises one selected from the group consisting of oxygen gas, nitrogen gas and a mixture of them.

4. The method of claim 1, wherein said adhesion layer comprises one of titanium and tantalum.

* * * * *